(12) United States Patent
Wistrom

(10) Patent No.: US 10,168,612 B2
(45) Date of Patent: Jan. 1, 2019

(54) PHOTOMASK BLANK INCLUDING A THIN CHROMIUM HARDMASK

(71) Applicant: GLOBALFOUNDRIES Inc., Grand Cayman (KY)

(72) Inventor: Richard Wistrom, Essex Junction, VT (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/375,623

(22) Filed: Dec. 12, 2016

(65) Prior Publication Data

US 2018/0164674 A1   Jun. 14, 2018

(51) Int. Cl.
| | |
|---|---|
| *G03F 1/26* | (2012.01) |
| *G03F 1/38* | (2012.01) |
| *G03F 1/76* | (2012.01) |
| *G03F 1/78* | (2012.01) |
| *G03F 1/80* | (2012.01) |

(52) U.S. Cl.
CPC ............. *G03F 1/26* (2013.01); *G03F 1/38* (2013.01); *G03F 1/76* (2013.01); *G03F 1/78* (2013.01); *G03F 1/80* (2013.01)

(58) Field of Classification Search
CPC ..... G03F 1/26; G03F 1/38; G03F 1/76; G03F 1/78; G03F 1/80
USPC .......................................................... 430/5
See application file for complete search history.

(56) References Cited

U.S. PATENT DOCUMENTS

| | | | |
|---|---|---|---|
| 7,691,546 B2 | 4/2010 | Yoshikawa et al. | |
| 7,767,367 B2 | 8/2010 | Yoshikawa et al. | |
| 8,399,158 B2 | 3/2013 | Choi et al. | |
| 8,920,666 B2 | 12/2014 | Igarashi et al. | |
| 9,188,852 B2 | 11/2015 | Fukaya et al. | |
| 2003/0186137 A1 | 10/2003 | Chan | |
| 2010/0075236 A1* | 3/2010 | Hashimoto | G03F 1/32 430/5 |
| 2016/0377974 A1* | 12/2016 | Chen | G03F 1/26 430/5 |
| 2016/0377975 A1* | 12/2016 | Matsumoto | G03F 1/32 430/5 |
| 2017/0052442 A1* | 2/2017 | Hsu | G03F 1/80 |

FOREIGN PATENT DOCUMENTS

WO   WO-2015/141078   * 9/2015

* cited by examiner

*Primary Examiner* — John A McPherson
(74) *Attorney, Agent, or Firm* — Thompson Hine LLP; Anthony Canale

(57) ABSTRACT

Methods for manufacturing a photomask, photomask blanks, and photomasks used in chip fabrication. A phase-shift layer is formed on a mask blank, a hardmask layer is formed on the phase-shift layer, and a layer stack is formed on the hardmask layer to make a photomask blank. The layer stack includes a first layer comprised of a first material and a second layer comprised of a second material that can be etched selective to the first material. The first layer is thicker than the second layer, and the first layer is also thicker than the hardmask layer. The photomask blank may be used to make a photomask in which, during manufacture, the hardmask layer is used to pattern mask features in a chip area of the photomask and the thicker of the first layer or the second layer is used to pattern a frame of the photomask.

14 Claims, 3 Drawing Sheets

PHOTOMASK BLANK INCLUDING A THIN CHROMIUM HARDMASK

BACKGROUND

The present invention relates to integrated circuit fabrication and, more specifically, to photomask blanks, photomasks used in chip fabrication, and the manufacture of a photomask.

Phase shift masks are photomasks that leverage the interference generated by phase differences to thereby improve image resolution. The fabrication of a phase shift mask blank typically involves patterning a layer of a translucent material carried on a mask blank with an etching process to form a mask pattern. Light is projected through the mask pattern of the phase shift mask onto a wafer to expose a layer of a light sensitive material. It is important that during wafer printing, light passes only through the chip area of the mask. If light passes through the mask region outside of the chip area, that stray light distorts the chip pattern. Therefore, the phase shift mask blank includes a thick opaque frame at its periphery that interacts with the reticle masking blades (REMA blades) on a photolithographic stepper tool to block stray light. The thick frame must have a high optical density that is related to its thickness.

In conventional phase shift masks, the same opaque material layer used to form the frame is used as a hardmask to form the mask pattern by patterning the underlying layer of phase-shift material. This duality in function requires the opaque material layer to have a thickness (e.g., 50 nanometers or larger) that is far thicker than an optimal thickness for forming the mask pattern. For example, due to the thickness of the opaque material layer, a thick resist layer must be used to pattern both the frame and the mask pattern.

SUMMARY

According to an embodiment, a method includes receiving a structure including a mask blank and a layer stack on the mask blank in which the layer stack includes a frame layer, a first hardmask layer, and a phase-shift layer between the first hardmask layer and the mask blank. The frame layer is patterned to form a frame of the photomask. After the frame layer is patterned, the first hardmask layer is patterned in a chip area interior of the frame to form a plurality of features. After the first hardmask layer is patterned, the phase-shift layer is patterned to form a plurality of mask features at locations masked by the features of the first hardmask layer. The frame layer is thicker than the hardmask layer. The frame is configured to block light from entering from outside of the chip area when the photomask is used in a lithography tool.

According to an embodiment, a structure includes a mask blank, a phase-shift layer on the mask blank, a hardmask layer on the phase-shift layer, and a layer stack on the hardmask layer. The layer stack includes a first layer comprised of a first material and a second layer comprised of a second material that can be etched selective to the first material. The first layer is thicker than the second layer, and the first layer is also thicker than the hardmask layer.

According to an embodiment, a photomask includes a mask blank, a frame surrounding a chip area on the mask blank, and a plurality of mask features on the mask blank and in the chip area. The mask features are comprised of a phase-shift material. The frame includes a frame layer supported on a portion of the phase-shift material and a portion of a hardmask layer located between the portion of phase-shift material and the frame layer. The frame layer is thicker than the hardmask layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
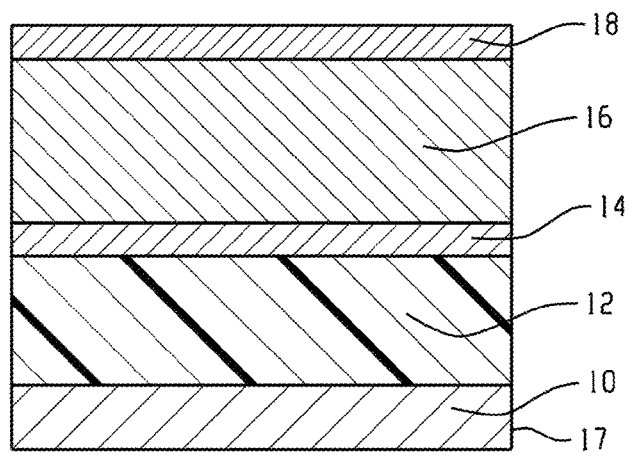
FIGS. 1-5 are cross-sectional views of a phase shift mask at successive stages of a fabrication method in accordance with embodiments of the invention.

With reference to FIG. 1 and in accordance with embodiments of the invention, a mask blank 10 is coated with a plurality of layers 12, 14, 16, 18 that are applied in a layer stack to form a photomask blank, such as a phase-shift photomask blank. The mask blank 10 may be a substrate that is composed of an optically transmissive material, such as fused silica (e.g., quartz) or soda-lime glass. Layers 14 and 16 are located in the layer stack vertically between layer 12 and layer 18. Layer 12 is located in the layer stack on a top surface of the mask blank 10, layer 14 is located in the layer stack on a top surface of layer 12, layer 16 is located in the layer stack on a top surface of layer 14, and layer 18 is located in the layer stack on a top surface of layer 16. The layers 12, 14, 16, 18 may cover the entirety of the surface area of the mask blank 10 interior of its outer peripheral edge 17.

Layer 12 may be composed of a phase-shift material, such as molybdenum silicide (MoSi), that is translucent and capable of light attenuation and that provides a phase shift characteristic required for the features of a phase shift photomask used in chip fabrication. Layer 16 may be composed of a material, such as opaque molybdenum silicide (MoSi), having a high optical density at small thicknesses. Layer 16 may have a thickness that ranges from 50 nanometers to 100 nanometers. Layer 14 and layer 18 may each be comprised of the same material, such as chromium (Cr). Each of the layers 14, 18 may have a thickness in a range (e.g., 3 nanometers to 5 nanometers) that is adequate to function as an etch hardmask. Layer 18 may have a thickness that is less than the thickness of layer 16 and, in an embodiment, and the thickness of layer 18 may be less than 50 nanometers. Layer 14, which is not optically opaque, may have an optical density that is less than 2.5.

Figure 2:
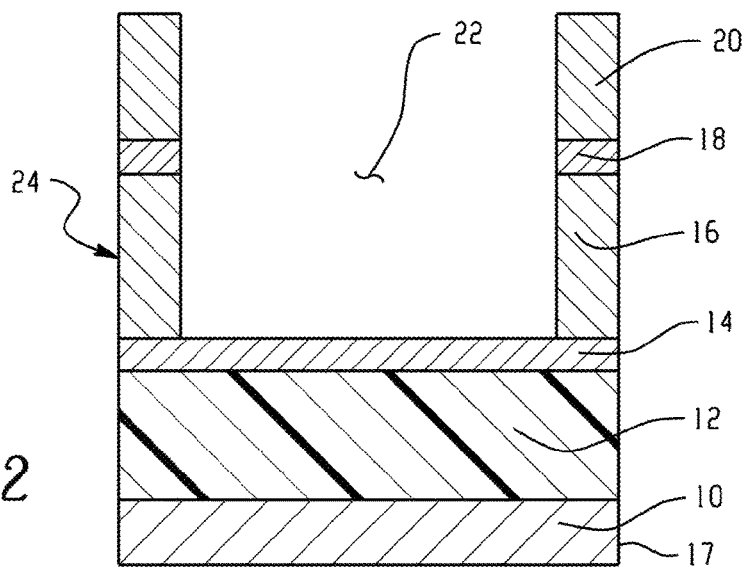

With reference to FIG. 2 in which like reference numerals refer to like features in FIG. 1 and at a subsequent fabrication stage, a resist layer 20 may be applied as a coating to layer 18 and patterned to generate a pattern in the resist layer 20 that masks an area of layer 18 generally aligned with the periphery of the mask blank 10. The resist layer 20 may also be used to pattern alignment marks that are used to orient a subsequent chip pattern. In an embodiment, the resist layer 20 may be sensitive to exposure by radiation from a laser and a laser writing tool may be used to expose the resist layer 20 during patterning.

The patterned resist layer 20 is used as an etch mask for one or more etching process that remove the layers 16, 18 from a chip area 22 of the mask blank 10. To provide precision in the etched depths, the etching process removing layer 18 from the chip area 22 may be end pointed to stop on the material of the layer 16 and the etching process removing layer 16 from the chip area 22 of the mask blank 10 may be end pointed to stop on the material of the layer 14. An etch chemistry, such as a dry etch using a source gas mixture of chlorine and oxygen, may be chosen that removes the material of the layer 18 selective to the material of layer 16. Layer 14 is preferably not etched by the etching process removing the material of layer 16. An etch chemistry, such as a dry etch using sulfur hexafluoride or carbon tetrafluoride as a source gas, may be chosen that removes the material of the layer 16 selective to the material of layer 14. As used herein, the term "selective" in reference to a material removal process (e.g., etching) denotes that, with an appropriate etchant choice, the material removal rate (e.g., etch rate) for the targeted material is higher than the removal rate for at least another material exposed to the material removal process.

The residual section of layer 16 forms a frame, generally indicated by reference numeral 24, that surrounds the chip area 22 of the mask blank 10 from which the layers 16, 18 are removed. The frame 24 is capped by a residual section of layer 18. Layers 12 and 14 are intact after the frame 24 is formed. The frame 24 is formed without the assistance of any type of electron beam writing tool during the patterning of the resist layer 20.

The frame 24 has a given optical density due to its thickness and material properties that blocks light at the wavelength used by the stepper. The optical density of a substance, such as the frame 24, represents the degree of the attenuation of transmitted radiant power through the substance, and may be numerically equal to the logarithmic ratio of the intensity of transmitted light to the intensity of the incident light passing through the substance. In an embodiment, the frame 24 should have a thickness, in combination with material properties that is sufficient to be optically opaque with an optical density greater than 2.5. In an embodiment, the width of the frame 24 may be on the order of 1 millimeter to 3 millimeters.

Figure 3:
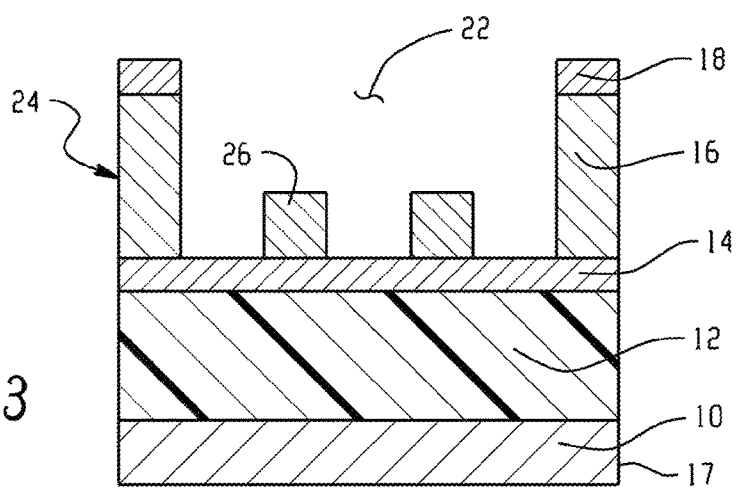

With reference to FIG. 3 in which like reference numerals refer to like features in FIG. 2 and at a subsequent fabrication stage, a resist layer 26 may be applied as a coating to layer 18 and patterned to form one or more features located in the chip area 22 from which the layers 16, 18 were removed when forming the frame 24. The resist constituting the resist layer 26 may be sensitive to exposure by an electron beam, and an electron beam writing tool may be used to expose the resist layer 26 and print its features. Because the frame 24 formed before the resist layer 26 is patterned, the higher-precision electron beam writing tool does not need to be used to print a feature in the resist layer 26 that is correlated with a frame. The resist layer 26 may be significantly thinner than resist layer 20 in order to facilitate the formation of mask features that are smaller in dimensions than the frame 24.

Figure 4:
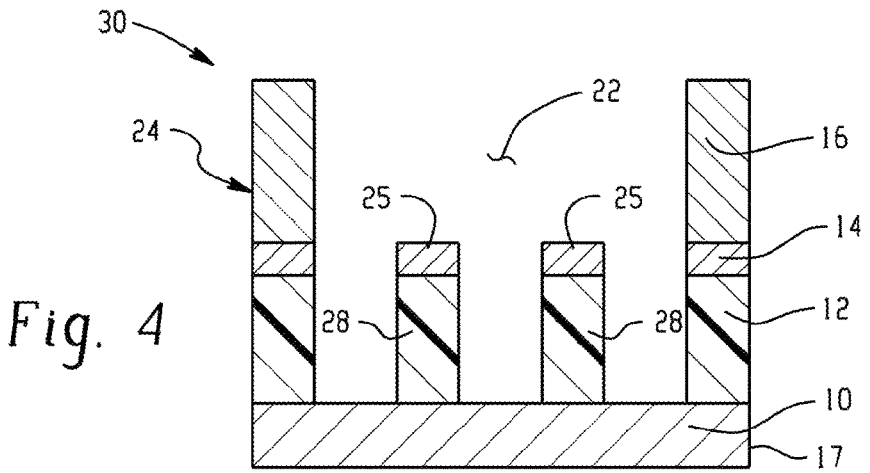

With reference to FIG. 4 in which like reference numerals refer to like features in FIG. 3 and at a subsequent fabrication stage, the patterned resist layer 26 is used as an etch mask for an etching process that patterns the layer 14 in the chip area 22 to form a hardmask that includes features 25 in a pattern transferred from the pattern of features in the resist layer 26. If the resist layer 26 is comprised of a negative resist material, then the frame 24 will not be masked by the resist layer 26 and the sections of layer 18 that cap the layer 16 will be removed when layer 14 is patterned by etching. The frame 24 does not require masking by the resist layer 26 because the initial thickness of the layer 16 is sufficient to tolerate minor material loss and thinning while still maintaining the optical density necessary for wafer printing. Consequently, the resist layer 26 does not need to be printed on the frame 24 to protect the mask frame 24 from the etch. However, if the resist layer 26 is comprised of a positive resist material, then the capping sections of layer 18 on frame 24 will be masked and retained when the layer 14 is etched to form features 25.

With the features 25 of the patterned layer 14 serving as a hardmask, the material of layer 12 is patterned in the chip area 22 interior of the frame 24 by an etching process to form features 28 from layer 12 at the locations of masking features 25. An etch chemistry, such as a dry etch using a source gas mixture of chlorine and oxygen, may be chosen that removes the material constituting the layer 12 selective to the constituent material of layer 14. The resist layer 26 may be stripped after the features 28 are formed in layer 12.

The features 28 of the photomask 30, which have critical dimensions that are significantly smaller than the width of the frame 24, are used in conjunction with a photolithography tool to expose a resist layer used as a mask in front-end-of-line (FEOL) wafer processing, middle-of-line (MOL) wafer processing, or back-end-of-line (BEOL) wafer processing. The features 28 have a layout with precise geometrical shapes arranged in a pattern transferred to from the photomask 30 to an exposed resist layer. In use, photolithographic light (e.g., at a wavelength of 193 nm) from a light source of the photolithography tool is attenuated (e.g., typically in the range of 5% to 20% transmission) when transmitted through the thickness of the features 28 to produce a phase difference (e.g., 180°) in comparison with the photolithographic light transmitted without attenuation through areas of the mask blank 10 that are not covered by the features 28. Interference due to the phase difference improves image resolution in photolithography.

The frame 24 is supported on a portion of the hardmask layer 14 and a portion of the layer 12 of phase-shift material. The frame 24 operates as a hardmask during the etching process forming the features 28 such that the respective portions of layers 12 and 14 are not etched when the features 28 are formed. Consequently, the supporting portions of layers 12 and 14 retain their initial as-deposited thicknesses.

Figure 5:
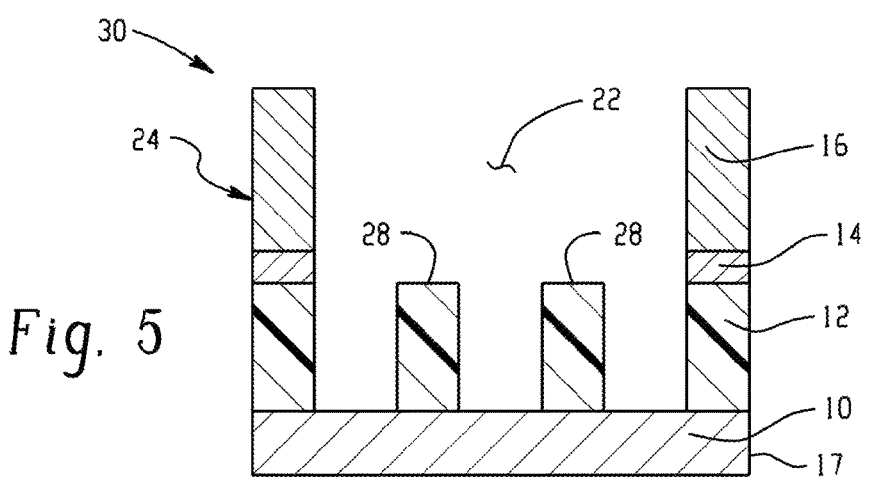

With reference to FIG. 5 in which like reference numerals refer to like features in FIG. 4 and at a subsequent fabrication stage, the features 25 of the patterned layer 14 are removed selective to the features 28 in order to provide a completed photomask 30 having the form of a phase shift mask. The initial thickness of the layer 16 is sufficient to tolerate minor material loss and thinning with a negligible loss of optical density when the features 25 are removed. As discussed above, if the resist layer 26 is comprised of a negative resist material when the layer 14 is patterned, then the capping sections of layer 18 on frame 24 may be stripped at this fabrication stage along with the capping sections of layer 14 on features 28.

Figure 6:
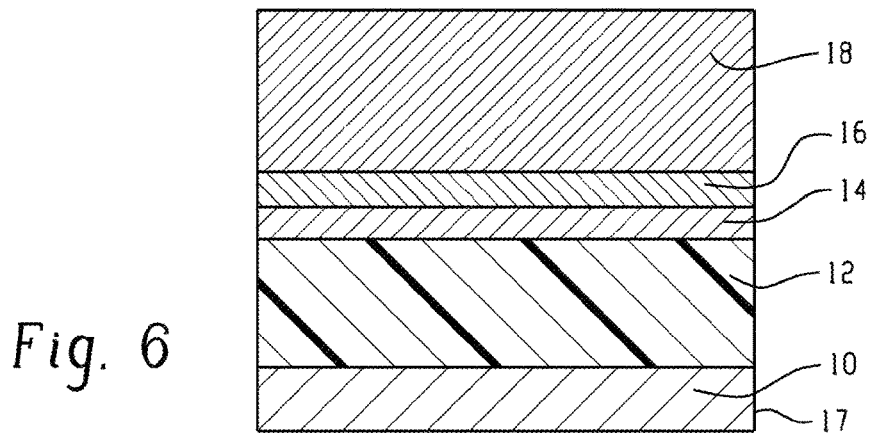
FIGS. 6-8 are cross-sectional views of a phase shift mask at successive stages of a fabrication method in accordance with embodiments of the invention.

With reference to FIG. 6 in which like reference numerals refer to like features in FIG. 1 and in accordance with embodiments of the invention, the layer stack that is initially applied on the mask blank 10 may be modified to change the layer thicknesses of layers 16 and 18. Specifically, layer 18 may be thickened and layer 16 may be thinned to have a smaller thickness than layer 18. The thickness of layer 16 is considerably less than the thickness of layer 18. Layer 18 may have a thickness ranging from 50 nanometers to 100 nanometers, and layer 16 may have a thickness in a range (e.g., 3 nanometers to 5 nanometers) that is adequate to function as an etch stop layer. In an embodiment, the layer 14 may be at least an order of magnitude thinner than the layer 18.

Figure 7:
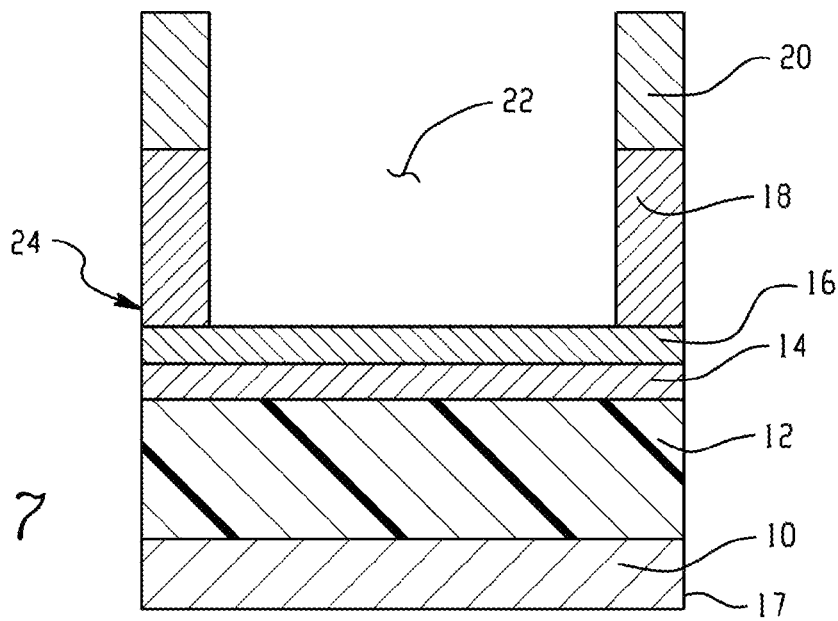

With reference to FIG. 7 in which like reference numerals refer to like features in FIG. 6 and at a subsequent fabrication stage, the resist layer 20 is applied as described in connection with FIG. 2 and the layer 18 is patterned by masked etching to form the frame 24 at the periphery of the mask blank 10 and to open the chip area 22 to the depth of layer 16. The material constituting the layer 18 is chosen to etch selective to the material constituting the layer 16 such that layer 16 operates as an etch stop for the process etching layer 18 to define the frame 24. After layer 18 is patterned and with the resist layer 20 in place, layer 16 is etched and removed from chip area 22 by an etching process that removes the material constituting layer 16 selective to the material constituting layer 14. The frame 24 masks the underlying a portion of layer 16, which is retained with its initial thickness at a vertical location between the frame 24 and the layer 14. The etch chemistry of the etching process patterning layer 18 is different than the etching process patterning layer 16 to provide the selectivity during the successive etching processes.

In an embodiment, the thickness of the frame 24, in combination with material properties, is sufficient for the frame 24 to be optically opaque with an optical density greater than 2.5. In an embodiment, the width of the frame 24 may be on the order of 1 millimeter to 3 millimeters.

Figure 8:
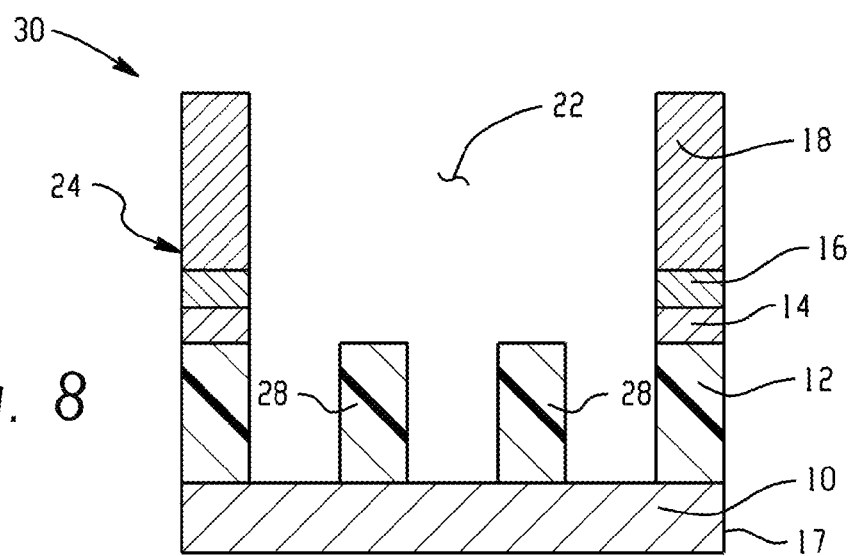

With reference to FIG. 8 in which like reference numerals refer to like features in FIG. 7 and at a subsequent fabrication stage, the process fabricating the photomask proceeds as described in FIGS. 3 and 4 to produce the photomask 30. In the completed photomask 30, sections of layers 12, 14, and 16 are located between the frame 24 and the mask blank 10.

The formation of the frame 24 is asynchronous with the formation of the mask features 28 in that different hardmask layers are used in their formation. In particular, a thin layer 14 is patterned using a thinner than normal resist layer to provide a hardmask that is subsequently used when forming the features 28. In contrast to the width of the frame 24, the width of the mask features 28 may be less than or equal to 100 nanometers. The need for a much thicker hardmask layer and a much thicker resist layer are avoided as in conventional processes forming phase shift masks. The result of these modifications to the convention process is an improvement to the photomask 30 that may improve resolution, linearity, and/or critical dimension uniformity (CDU).

The asynchronous formation of the frame 24 and the mask features 28 eliminates the need for a unique formulation of the normal hardmask material, e.g., a chromium-based formulation that is both highly optically opaque and fast etching. The material from which the frame 24 is formed may be optimized in composition to provide the needed level of optical density. The material forming the hardmask layer 14 for forming the mask features 28 can be thinner (e.g., 3 nm to 5 nm) than in a conventional process (e.g., 50 nm) and, therefore, may be optimized for patterning the features 28 in the chip area 22 because a high optical opacity is not needed for forming a frame using the hardmask layer 14.

The ability to laser write the resist layer 20 and pattern the frame 24 may reduce the delay between e-beam writing and metrology because the frame is patterned before e-beam write instead of after as in the present art. This enables quicker feedback (by about 1 day) between e-beam write and metrology. In addition, the time required to pattern the resist layer 26 may be reduced because the electron-beam writer does not have to write a feature to protect the frame 24 during the etching of the features 28. Instead, the resist layer 20 can be written more quickly using a laser writer, which is faster than the higher-resolution electron-beam writer used to write the resist layer 26. The use of a laser writer is permitted because a lower spatial precision needed during the exposure of the resist layer 20 to form the feature used in conjunction with patterning the frame 24. In instances in which the resist layer 20 is comprised of a negative resist, the critical dimension uniformity (CDU) of the mask features 28 written by the electron-beam writing tool is improved near the frame 24. This reduction in critical dimension variability arises because the frame 24 is patterned before the features 28, which eliminates the need to pattern the frame using the e-beam tool.

The asynchronous formation of the frame 24 and the mask features 28 may also make sub-resolution assist features, which are included among the features 28 of the photomask 30, less susceptible to breakage while capped by the patterned hardmask layer associated with their patterning. Specifically, the sub-resolution assist features are formed using hardmask layer 14 with a thickness that is reduced in comparison with the thickness of conventional hardmask layers when used to pattern both the frame and mask features. The consequence is that the sub-resolution assist features formed using layer 14 are thinner and possess an improved aspect ratio because layer 14 has a considerably smaller thickness (e.g., 4 nm) than the thickness (e.g., 50 nm) of a conventional hardmask layer. In addition, only two process steps (e.g., stripping the resist layer 26 and removing the capping layer 14) occur subsequent to the patterning of layer 14 and the patterning of the sub-resolution assist features while capped by sections of layer 14, whereas the conventional process may require up to six process steps that provide more opportunities to inflict damage to the fragile sub-resolution assist features.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a mask blank, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the mask blank as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a photomask, the method comprising:
    receiving a structure including a mask blank and a layer stack on the mask blank in which the layer stack includes a frame layer, a hardmask layer, an etch stop layer between the frame layer and the hardmask layer, and a phase-shift layer between the hardmask layer and the mask blank;
    patterning the frame layer with a first etching process that removes the frame layer selective to the etch stop layer to form a frame of the photomask;
    after patterning the frame layer, removing the etch stop layer from the hardmask layer over a chip area interior of the frame with a second etching process that removes the etch stop layer selective to the hardmask layer;
    after removing the etch stop layer, patterning the hardmask layer in the chip area to form a plurality of features; and
    after patterning the hardmask layer, patterning the phase-shift layer to form a plurality of mask features at locations masked by the features of the hardmask layer,
    wherein the frame layer is thicker than the hardmask layer, and the frame is configured to block light outside of the chip area from entering the chip area when the photomask is used in a lithography tool.

2. The method of claim 1 further comprising:
    patterning a first resist layer used as a first etch mask when etching the frame layer; and
    patterning a second resist layer used as a second etch mask when etching the hardmask layer.

3. The method of claim 2 wherein the second resist layer is thinner than the first resist layer.

4. The method of claim 2 wherein the frame is not masked by the second resist layer when the hardmask layer is etched.

5. The method of claim 2 wherein the first resist layer is patterned using a laser writer, and the second resist layer is patterned using an electron beam writer.

6. The method of claim 1 wherein the hardmask layer has a thickness ranging from 3 nanometers to 5 nanometers, and the frame layer has a thickness ranging from 50 nanometers to 100 nanometers.

7. The method of claim 1 wherein the hardmask layer is comprised of chromium, and the etch stop layer is comprised of opaque molybdenum silicide.

8. The method of claim 7 wherein the frame layer is comprised of chromium.

9. A photomask comprising:
    a mask blank;
    a frame surrounding a chip area on the mask blank; and
    a plurality of mask features on the mask blank and in the chip area, the mask features comprised of a phase-shift material,
    wherein the frame includes a frame layer supported on a portion of the phase-shift material, a portion of a hardmask layer and a portion of an etch stop layer are arranged between the portion of the phase-shift material and the frame layer, and the frame layer is thicker than the hardmask layer.

10. The photomask of claim 9 wherein the hardmask layer is comprised of chromium, and the etch stop layer is comprised of opaque molybdenum silicide.

11. The photomask of claim 10 wherein the frame layer is comprised of chromium.

12. The photomask of claim 9 wherein the frame layer and the hardmask layer are each comprised of chromium.

13. The photomask of claim 9 wherein the hardmask layer has a thickness ranging from 3 nanometers to 5 nanometers, and the frame layer has a thickness ranging from 50 nanometers to 100 nanometers.

14. The photomask of claim 9 wherein the portion of the etch stop layer is arranged between the portion of the hardmask layer and the frame layer.

* * * * *